(12) United States Patent
Krueger et al.

(10) Patent No.: US 7,808,845 B2
(45) Date of Patent: Oct. 5, 2010

(54) METHODS AND SYSTEMS TO WRITE TO SOFT ERROR UPSET TOLERANT LATCHES

(75) Inventors: Dan Krueger, Fort Collins, CO (US); Kevin Duda, Denver, CO (US); Frank Verdico, Fort Collins, CO (US)

(73) Assignee: Intel Corporation, Santa Clara, CA (US)

( * ) Notice: Subject to any disclaimer, the term of this patent is extended or adjusted under 35 U.S.C. 154(b) by 123 days.

(21) Appl. No.: 12/240,318

(22) Filed: Sep. 29, 2008

(65) Prior Publication Data

US 2010/0080072 A1    Apr. 1, 2010

(51) Int. Cl.
*G11C 7/00* (2006.01)
(52) U.S. Cl. .............. 365/189.16; 365/189.05; 365/190
(58) Field of Classification Search ............ 365/189.05, 365/189.15, 189.16, 190, 154
See application file for complete search history.

(56) References Cited

U.S. PATENT DOCUMENTS

| | | | |
|---|---|---|---|
| 6,696,873 B2 | 2/2004 | Hazucha et al. | |
| 6,826,090 B1 * | 11/2004 | Chu et al. | 365/189.05 |
| 7,023,235 B2 * | 4/2006 | Hoff | 326/10 |
| 7,038,515 B2 | 5/2006 | Rusu et al. | |
| 7,161,404 B2 | 1/2007 | Hazucha et al. | |
| 7,576,583 B2 * | 8/2009 | Kuboyama et al. | 327/218 |
| 2004/0130351 A1 * | 7/2004 | Hazucha et al. | 327/15 |

OTHER PUBLICATIONS

Calin, T. et al., "Upset Hardened Memory Design for Submicron CMOS Technology", *IEEE Transactions on Nuclear Science*, vol. 43, No. 6, (Dec. 1996),2874-2878.
Hazucha, Peter et al., "IEEE Journal of Solid-State Circuits, vol. 39, No. 9,", (Sep. 2004),1536-1543.
Krueger, Dan et al., "Circuit Design for Voltage Scaling and SER Immunity on a Quad-Core Itanium Processor", *2008 IEEE International Solid-State Circuits Conference, ISSCC 2008, Session 4, Microprocessors 4.7*, (Feb. 4, 2008),2 pages.

* cited by examiner

*Primary Examiner*—Gene N. Auduong
(74) *Attorney, Agent, or Firm*—Garrett IP, LLC

(57) ABSTRACT

Methods and systems to write to redundant storage latches, or storage cells, including soft error upset tolerant latches and feedback-interlocked redundant storage cells, including to write a logic value to one of a plurality of same sense storage nodes, and to write a complementary logic value to a selected one of a plurality of opposite sense storage nodes responsive to the logic value. Remaining storage nodes may be written to through circuitry within the storage cell. Logic values may be output substantially simultaneously with corresponding write operations. A system may include a multiple logic level write circuit to write to the first same sense storage node, and first and second single logic level write circuits to write to the first and second opposite sense storage nodes, respectively.

20 Claims, 6 Drawing Sheets

METHODS AND SYSTEMS TO WRITE TO SOFT ERROR UPSET TOLERANT LATCHES

BACKGROUND

Redundant storage latches or storage cells include multiple storage nodes to store multiple instances of a logic value. Redundant storage cells are used in soft error upset tolerant (SEUT) circuits.

Redundant storage cells include a plurality of dual logic level write circuits to write to a corresponding plurality of same sense storage nodes. Dual logic level gate structures include complex interconnections, consume valuable space, and add parasitic capacitances to other circuits.

Redundant storage cells include storage cells having feedback interlock circuitry to generate feedback loops to maintain stored logic values, and circuitry to disable the feedback loops during a subsequent write operation. The circuitry to disable the feedback loops consumes additional space.

BRIEF DESCRIPTION OF THE DRAWINGS/FIGURES

Figure 1:
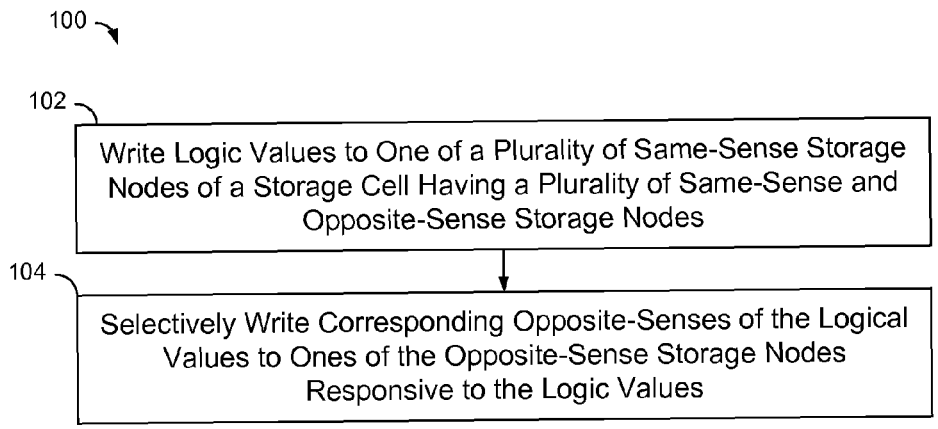
FIG. 1 is an exemplary process flowchart of a method of writing to a redundant storage cell.

In the drawings, the leftmost digit(s) of a reference number identifies the drawing in which the reference number first appears.

DETAILED DESCRIPTION

Disclosed herein are methods and systems to write to redundant storage latches, or storage cells, including feedback-interlocked redundant storage cells. The methods and systems include methods and systems to write logic values to one of a plurality of same sense storage nodes, and to selectively write corresponding complementary logic values ones of a plurality of opposite sense storage nodes responsive to the logic values.

FIG. 1 is an exemplary process flowchart of a method 100 of writing to a redundant storage latch or cell.

At 102, logic values are written to one of a plurality of same sense storage nodes of a redundant storage cell having a plurality of same sense and opposite sense storage nodes.

At 104, corresponding opposite senses of the logic values are selectively written to ones of the plurality of opposite sense storage nodes, responsive to the logical value.

The selectively writing to ones of the opposite sense storage nodes may include writing a logic one to a first opposite sense storage node when the logic value is zero, and writing a logic zero to a second opposite sense storage node when the logic value is one.

A logical value written to the first same sense storage node, and a corresponding opposite sense logical value written to a selected one of the opposite sense storage nodes, may be written to a second one of the same sense storage nodes and an unselected opposite sense storage node through feedback circuitry within the redundant storage cell.

Method 100 may further include outputting logic values substantially simultaneously with corresponding writings of the logic values to the first same sense storage node.

Method 100 may further include writing scan test values to the redundant storage cell substantially as described above with respect to logic values.

Figure 2:
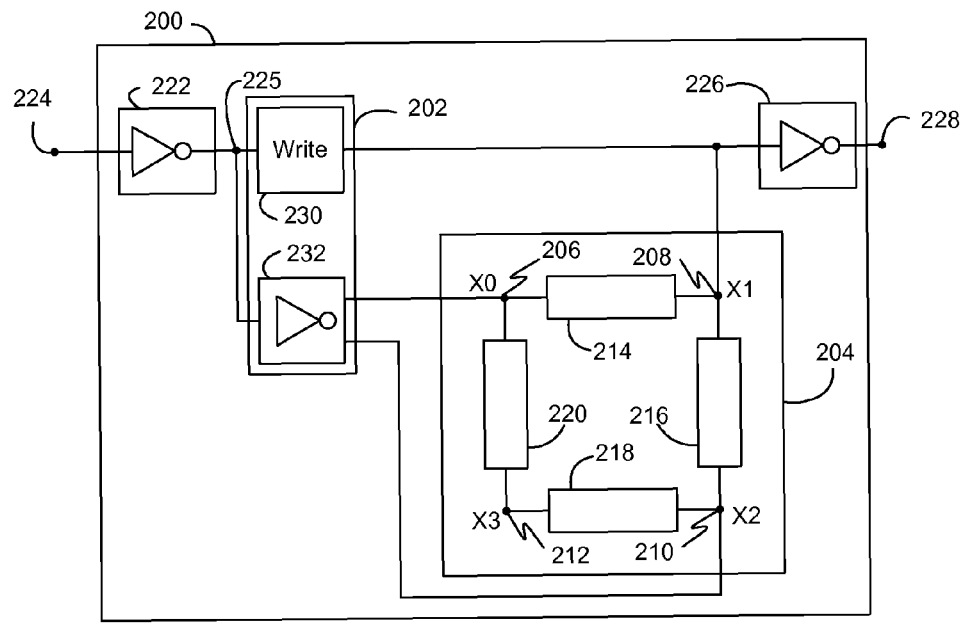
FIG. 2 is an exemplary block diagram of a redundant storage system.

FIG. 2 is a block diagram of an exemplary redundant storage system 200, including a write circuit 202 and a redundant storage cell 204.

Storage cell 204 includes a plurality of same sense and opposite sense storage nodes, illustrated here as same sense storage nodes 208 and 212, and opposite sense storage nodes 206 and 210. Storage nodes 206, 208, 210, and 212 are also referred to herein as storage nodes X0, X1, X2, and X3, respectively. Storage cell 204 may be configured to store two pairs of complementary data values at respective storage nodes X0 through X3, which may be either 0101 or 1010.

Storage cell 204 may include a plurality of circuits 214 through 220, coupled between adjacent sets of a same sense and an opposite sense storage nodes X1 and X2, X2 and X3, and X3 and X0, and X0 and X1, to selectively reinforce or isolate adjacent storage nodes depending upon the logic states of the storage nodes. Circuits 214 through 220 may include feedback interlock circuits as described below with respect to FIGS. 3 and 4.

Figure 3:
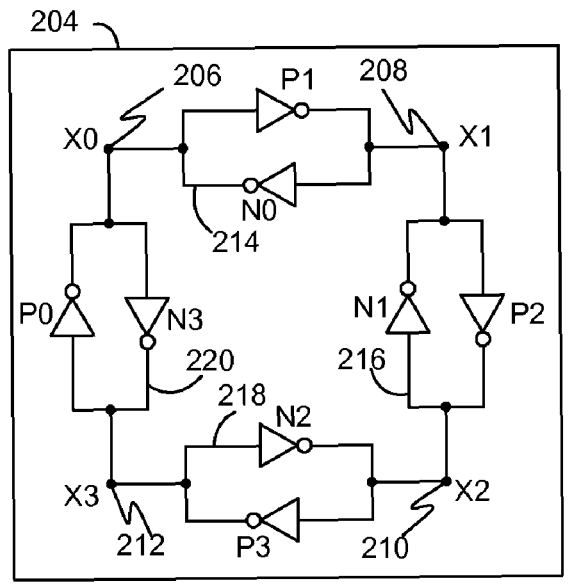
FIG. 3 is an exemplary block diagram of a storage cell including P-type and N-type inverter circuits.

FIG. 3 is an exemplary block diagram of storage cell 204, wherein circuits 214, 216, 218, and 220 include inverter-based feedback interlock circuitry, illustrated here as P-type and N-type inverter circuits, as indicated by notations of P and N, respectively. Such a configuration is commonly known as a dual interlocked storage cell. Storage cell 204 is not, however, limited to a dual interlocked storage cell.

Figure 4:
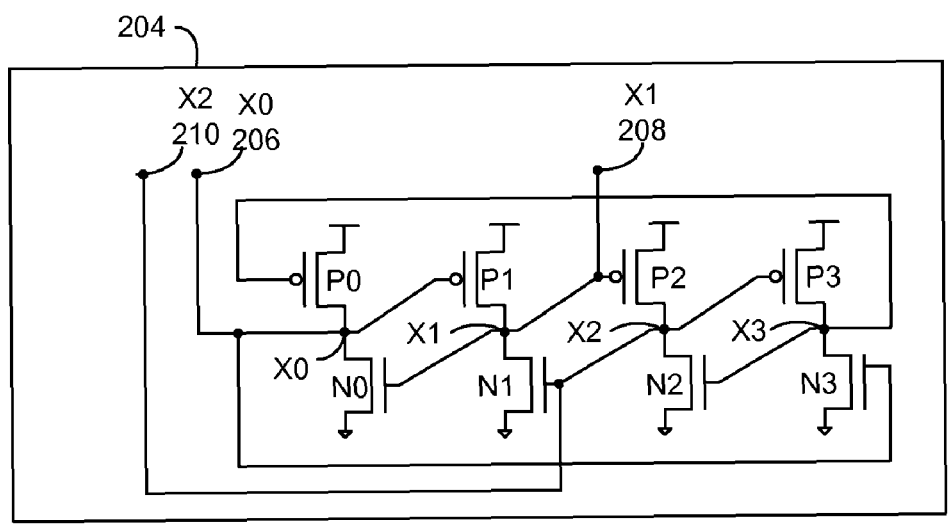
FIG. 4 is an exemplary circuit diagram of the storage cell including the P-type and N-type transistor circuits.

FIG. 4 is an exemplary circuit diagram of storage cell 204, wherein the P-type and N-type inverter circuits of FIG. 3 include P-type and N-type transistors.

In operation, when storage nodes X0 and X2 are at logic level 1, and storage nodes X1 and X3 are at logic level 0, inverter pairs P0 and N3, and P2 and N1 are in conductive states and act as latches to store complementary logic values at corresponding storage node pairs X0 and X3, and X1 and X2. Conversely, inverter pairs P1 and N0, and P3 and N2 are in non-conductive states, essentially isolating circuit 216 and storage nodes X1 and X2 from circuit 220 and storage nodes X0 and X3.

Similarly, when storage nodes X0 and X2 are at logic level 0, and storage nodes X1 and X3 are at logic level 1, inverter pairs P1 and N0, and P3 and N2 are in conductive states and act as latches to store complementary logic values at corresponding storage node pairs X0 and X1, and X2 and X3. Conversely, inverter pairs P0 and N3, and P2 and N1 are in non-conductive states, essentially isolating circuit 214 and storage nodes X0 and X1 from circuit 218 and storage nodes X2 and X3.

A negative upset pulse at a node $X_i$, where i=0 . . . 3, may induce a positive pulse at node $X_{i+1}$ through inverter $P_{i+1}$, where i=0 . . . 3. The perturbation may not, however, affect the same logic state stored at node $X_{i-1}$, because the negative pulse at $X_i$ is blocked inverter $N_{i-1}$. The propagated positive perturbation at node $X_{i+1}$ is blocked from further transmission by inverter $P_{i+2}$. Nodes $X_{i-1}$ and $X_{i+2}$ are thus isolated and preserve their logic state. Temporary negative perturbations may thus be limited to nodes $X_i$ and $X_{i+1}$. The perturbation is subsequently removed due to the state-reinforcing feedback of nodes $X_{i-1}$ and $X_{i+2}$ through inverters $P_i$ and $N_{i+1}$.

Similarly, a positive transient upset pulse at node $X_i$ may be limited to node $X_{i-1}$ through inverter $N_{i-1}$.

Returning to FIG. 2, write circuit 202 includes a same sense write circuit 230 to write logic values from a node 225 to storage node X1, and an opposite sense write circuit 232 to selectively write a corresponding opposite sense logic value to one opposite sense storage nodes X0 and X2, depending upon the logic values at node 225.

For example, when a logic value of zero is written to storage node X1, a logic value of one may be written to opposite sense storage node X0. When a logic value of one is written to storage node X1, a logic value of zero may be written to opposite sense storage node X2.

When the logic values are different than logic values currently stored, writing to two opposite sense storage nodes may disrupt existing feedback interlocks, which may cause the remaining two storage cells to change states as well. Storage cell 204 may thus be written to without the use of additional circuitry to disable feedback-interlock loops.

In the example of FIG. 3, when storage nodes X0 through X3 are at states 0101, respectively, inverter pairs P1 and N0, and P3 and N2 are in conductive states, and inverter pairs P2 and N1, and P0 and N3 are in non-conductive states. When storage nodes X0 and X1 are thereafter written to with logic 1 and logic 0, respectively, inverter pair P1 and N0 become non-conductive, inverter P2 writes logic 1 to storage node X2, and inverter N3 writes logic 0 to storage node X3. The logic 1 at storage node X2 and the logic 0 at storage node X3, cause inverter pair P3 and N2 to be non-conductive.

Similarly, when storage nodes X0 through X3 are at states 1010, respectively, inverter pairs P2 and N1, and P0 and N3 are in conductive states, and inverter pairs P1 and N0, and P3 and N2 are in non-conductive states. When storage nodes X1 and X2 are thereafter written to with logic 1 and logic 0, respectively, inverter pair P2 and N1 become non-conductive, inverter N0 writes logic 0 to storage node X0, and inverter P3 writes logic 1 to storage node X3. The logic 0 at storage node X0 and the logic 1 at storage node X3, cause inverter pair P0 and N3 to be non-conductive.

Writing to two opposite sense storage nodes thus essentially disrupts and reconfigures the feedback interlocks, and results in writing to all of the storage nodes.

Referring back to FIG. 2, system 200 may include input buffer circuitry 222 coupled to an input node 224, and output buffer circuitry 226 coupled to an output node 228. Input buffer circuitry 222 and/or output buffer circuitry 226 may include logic, which may include one or more logic gates, and may include complimentary metal-oxide semiconductor (CMOS) integrated circuit logic gates. In the example of FIG. 2, input buffer circuitry 222 and output buffer circuitry 226 include inverters. Alternatively, one or more of include input buffer circuitry 222 and output buffer circuitry 226 may be omitted.

When a logic value is written to storage node X1, the logic value may be available for reading at output node 228 prior to writing corresponding logic values to one or more of storage nodes X0, X2, and X3.

One or more of write circuit 230 and opposite sense write circuit 232 may include multiple logic level circuits, which may include a combination of N-type and P-type devices, which may be configured in parallel as described below.

N-type devices may transfer logic values of zero relatively efficiently, and P-type devices may transfer logic values of one relatively efficiently. A multiple logic level circuit including N-type and P-type devices may thus provide relatively good transfer characteristics in writing multiple logic levels.

Alternatively, one or more of write circuits 230 and 232 may include one or more single logic level write circuits. A single logic level write circuit may include one or more of a predominantly N-type circuit to write logic values of zero, and a predominantly P-type circuit to write logic values of one. A single logic level write circuit may include a plurality of series-coupled gates. Single logic level write circuits, including series-coupled single level logic gates, may be implemented with reduced interconnection complexity, and may be implemented within smaller areas, relative to multiple logic level write circuits, such a parallel-coupled N-type and P-type devices.

Figure 5:
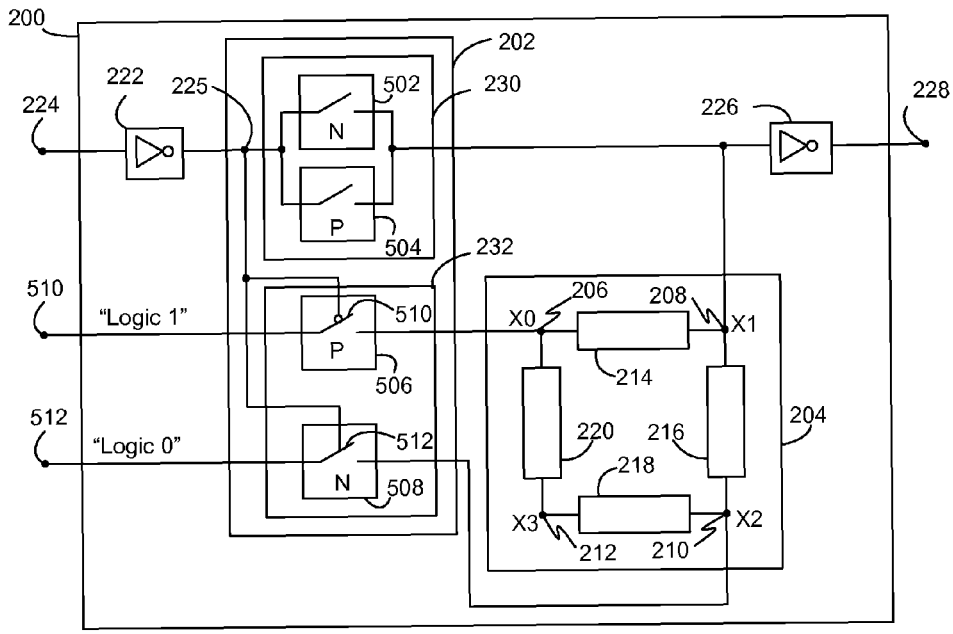
FIG. 5 is another exemplary block diagram of the redundant storage system.

FIG. 5 is another exemplary block diagram of system 200, wherein write circuit 230 includes a multiple logic level write circuit, including an N-type switch device 502 and a P-type switch device 504.

Write circuit 232 includes first and second single logic level write circuits 506 and 508. Write circuit 506 includes a P-type switch device 510 coupled between a logic 1 node 510 and opposite sense storage node X0. Write circuit 508 includes an N-type switch device 512 coupled between a logic 0 node 512 and opposite sense storage node X2. Logic 1 node 510 may be coupled to a positive system power supply, and logic 0 node 512 may be coupled to a system ground.

P-type switch device 510 and N-type switch device 512 each include a control node coupled to node 225.

In operation, a logic value of zero at node 225 controls P-type switch device 510 to couple logic 1 node 510 to opposite sense storage node X0. A logic value of one at node 225 controls N-type switch device 512 to couple logic 0 node 512 to opposite sense storage node X1.

Figure 6:
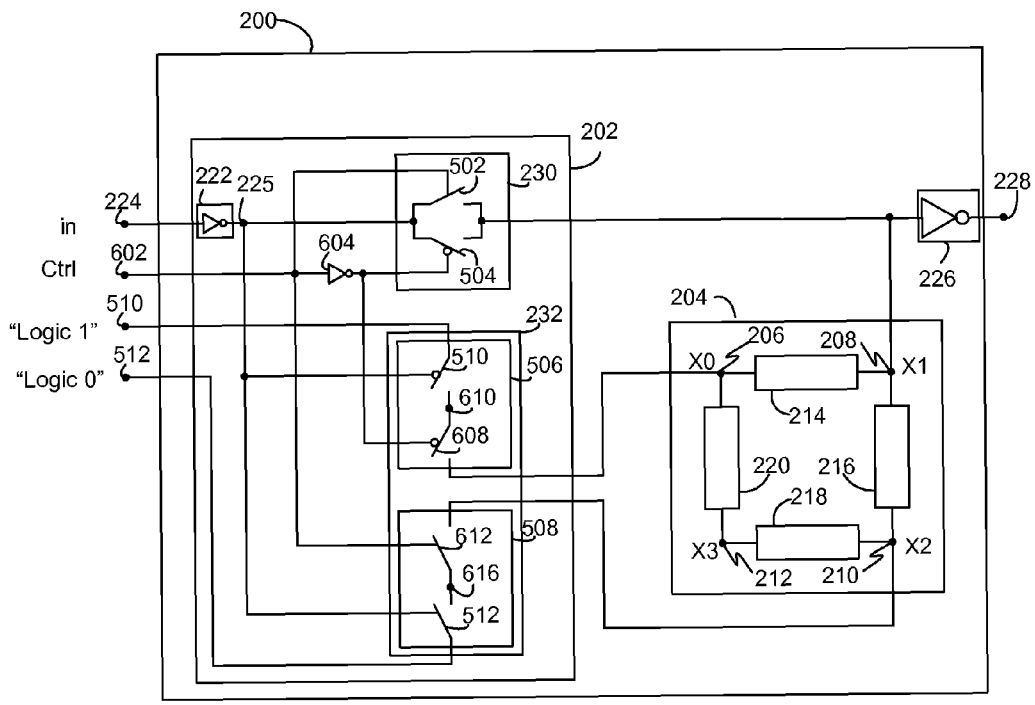
FIG. 6 is another exemplary block diagram of the redundant storage system.

FIG. 6 is another exemplary block diagram of system 200, illustrating exemplary write-control circuitry to control writing to storage cell 204.

Within write circuitry 230, N-type switch device 502 is coupled to a control or clock input node 602, and P-type switch device 504 is coupled to clock input node 602 through an inverter 604, to control N-type switch device 502 and P-type switch device 504 to close upon an active-high control signal at clock input node 602.

Within opposite sense write circuitry 232, single logic level write circuit 506 includes a second P-type switch device 608 coupled in series between P-type switch device 510 and opposite sense storage node X0. P-type switch device 608 includes a control node coupled to clock input node 602 through inverter 604, to control P-type switch device 606 to couple an intermediate node 610 to opposite sense storage node X0 in response to an active-high control signal at clock input node 602.

Also within opposite sense write circuitry 232, single logic level write circuit 508 includes a second N-type switch device 612 coupled in series between N-type switch device 512 and opposite sense storage node X2. N-type switch device 612 includes a control node coupled to node 225 to control N-type switch device 612 to couple an intermediate node 616 to opposite sense storage node X2 in response to an active-high control signal at clock input node 602.

Thus, when a logic value is present at node 225, the logic value controls one of P-type switch device 510 and N-type switch device 512 to present a logic value of one or zero, respectively, at a corresponding one of intermediate nodes 610 and 616. A corresponding or subsequent active-high control signal at clock input node 602 controls switch devices 502 and 504 to write the logic value from node 225 to storage node X1, and controls switch devices 608 and 612 to write either a logic 1 from intermediate node 610 to opposite sense storage node X0, or a logic 0 from intermediate node 616 to opposite sense storage node X2.

One or more N-type and P-type switch devices, as disclosed herein, may include, without limitation, a field effect transistor (FET), which may include one or more of an insulated gate FET (IGFET), a metal oxide semiconductor FET (MOSFET), a high electron mobility transistor (HEMT), and a junction gate FET (JFET).

Write circuit 202 may be configured to write opposite sense logic values to both of opposite sense storage node X0 and X2 substantially simultaneously, such as by coupling nodes 610 and 616 together.

Figure 6A:
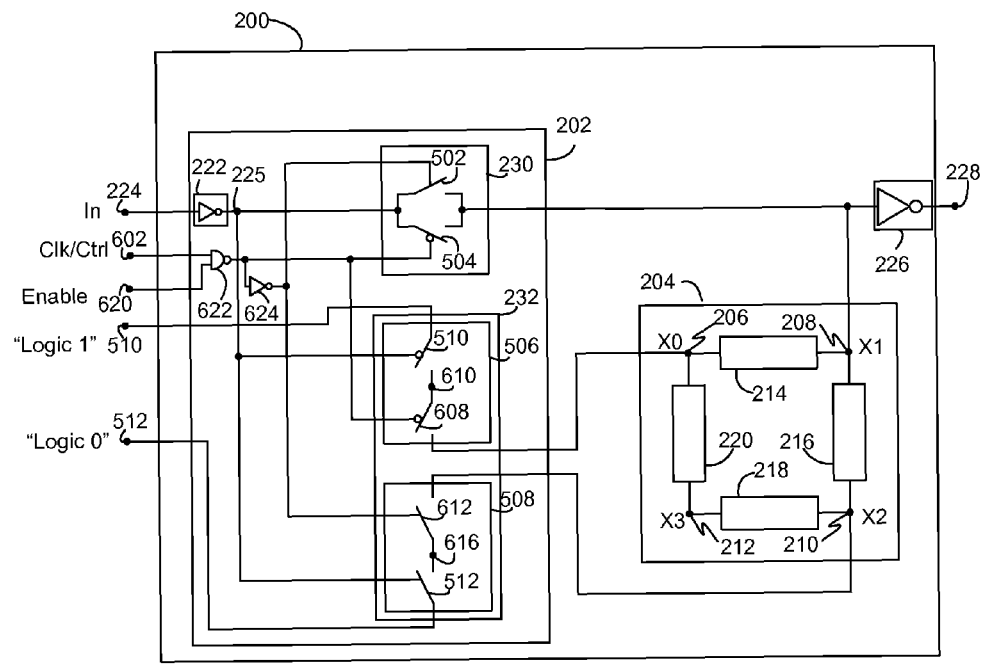
FIG. 6A is another exemplary block diagram of the redundant storage system.

Write circuit 202 may include latch update enable logic to control latch updates responsive to a clock signal and a latch update enable signal. Latch update enable logic may include AND-type logic to control write circuit 202 to perform latch updates when control signal 602 and the latch update enable signal are both high. For example, FIG. 6A is another exemplary block diagram of system 200, wherein write circuit 202 includes a NAND gate 622 to receive clock or control signal at clock node 602, and a latch update enable signal at an enable node 620. When the clock signal and the enable signal are at high logic states, NAND gate 622 outputs a low logic state to P-type switch device 504 and P-type switch device 608. Inverter 604 in FIG. 6 may thus be omitted. In FIG. 6A, write circuit 202 further includes an inverter 624 coupled between the output of NAND gate 622 and N-type switch device 502 and N-type switch device 612.

System 200 may be implemented as a pulse latch system. As described above with respect to FIG. 2, when a logic value is written to storage node X1, the logic value may be available for reading at output node 228 substantially simultaneously, which may be prior to writing corresponding logic values to one or more of storage nodes X0, X2, and X3. System 200 may thus receive latch updates relatively frequently, substantially without additional hold time circuitry, which may otherwise be handled with master-slave flip-flop, or back-to-back latch configurations.

Figure 6B:
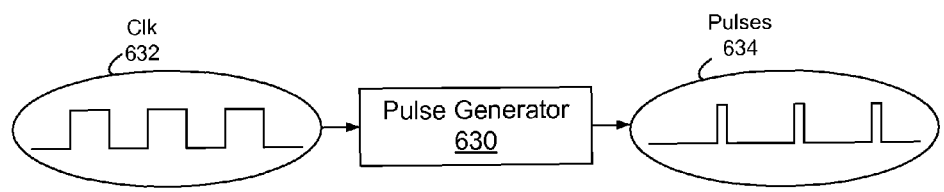
FIG. 6B is an exemplary block diagram of a pulse generator.

The relatively high speed of system 200 permits system 200 to be utilized as a pulse latch to perform latch updates in response to a pulse control signal. A control signal provided to clock input node 602 in FIG. 6, may include one or more pulse signals. FIG. 6B is exemplary block diagram of a pulse generator 630 to receive a clock signal 632 and to generate corresponding pulses 634. Pulses 634 may have a high logic state duration of, for example, one third of a high logic state duration of clock cycles of clock signal 632. Pulses 634 may be input to system 200 at clock input node 602. Alternatively, system 200 may include pulse generator 630 to receive clock signal 632 at clock input node 602, and to output pulses 634 to write circuit 202. Pulse generator 630 may be implemented as a conventional pulse generator. When system 202 is implemented as a pulse latch, it may be relatively less vulnerable to upsets due to reduced "on" times during latch updates.

Figure 7:
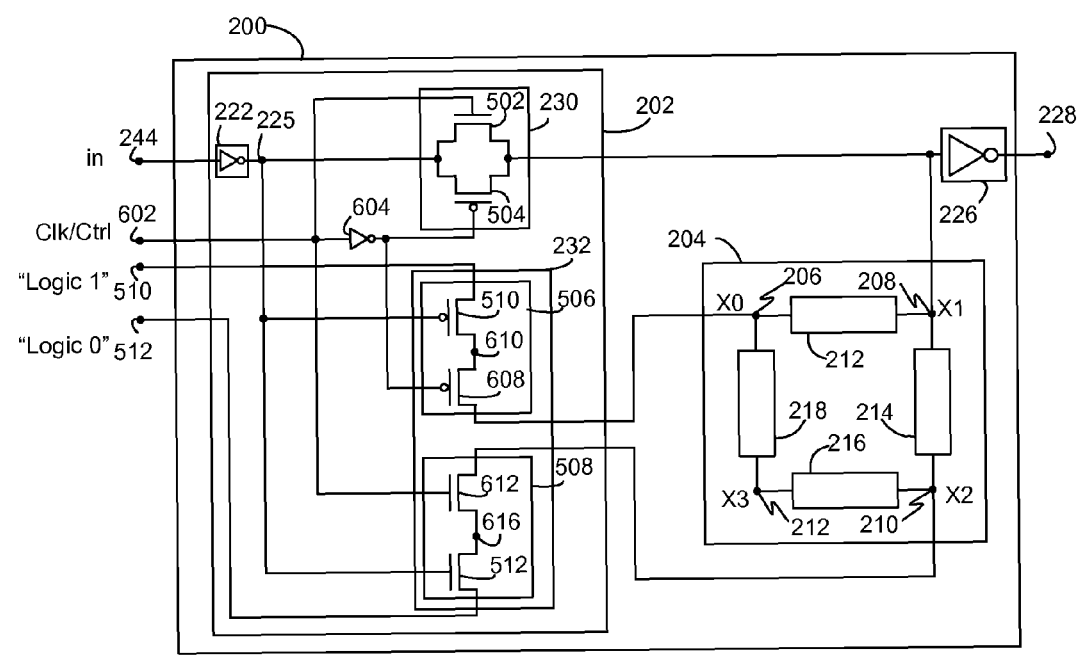
FIG. 7 is an exemplary circuit diagram of the redundant storage system.

FIG. 7 is an exemplary circuit diagram of system 200, wherein P-type switch devices and N-type switch devices of FIG. 6 are illustrated as MOSFETS, operation of which is substantially as described above with respect to FIG. 6.

In the examples of FIGS. 6 and 7, system 200 is configured for an active-high control signal at control node 510. Alternatively, system 200 may be configured for an active low control signal at control node 510.

In the example of FIGS. 6 and 7, switch devices 510 and 512 are controlled by logic values at input node 224, and switch devices 608 and 612 are controlled by a control input at clock input node 602. This configuration may be useful where system 200 is configured for data to arrive in advance of a control input, such that logic values are set at nodes 610 and 616 in advance of the control input. Alternatively, switch devices 510 and 512 may be controlled by clock input node 602, and switch devices 608 and 612 may be controlled by input node 224.

System 200 may include scan test circuitry to sequentially write and output a series of scan test logic values during a scan test mode. The scan test circuitry may include scan write circuitry configured substantially as described above with respect to one or more of FIGS. 2, 5, 6, and 7.

Figure 8:
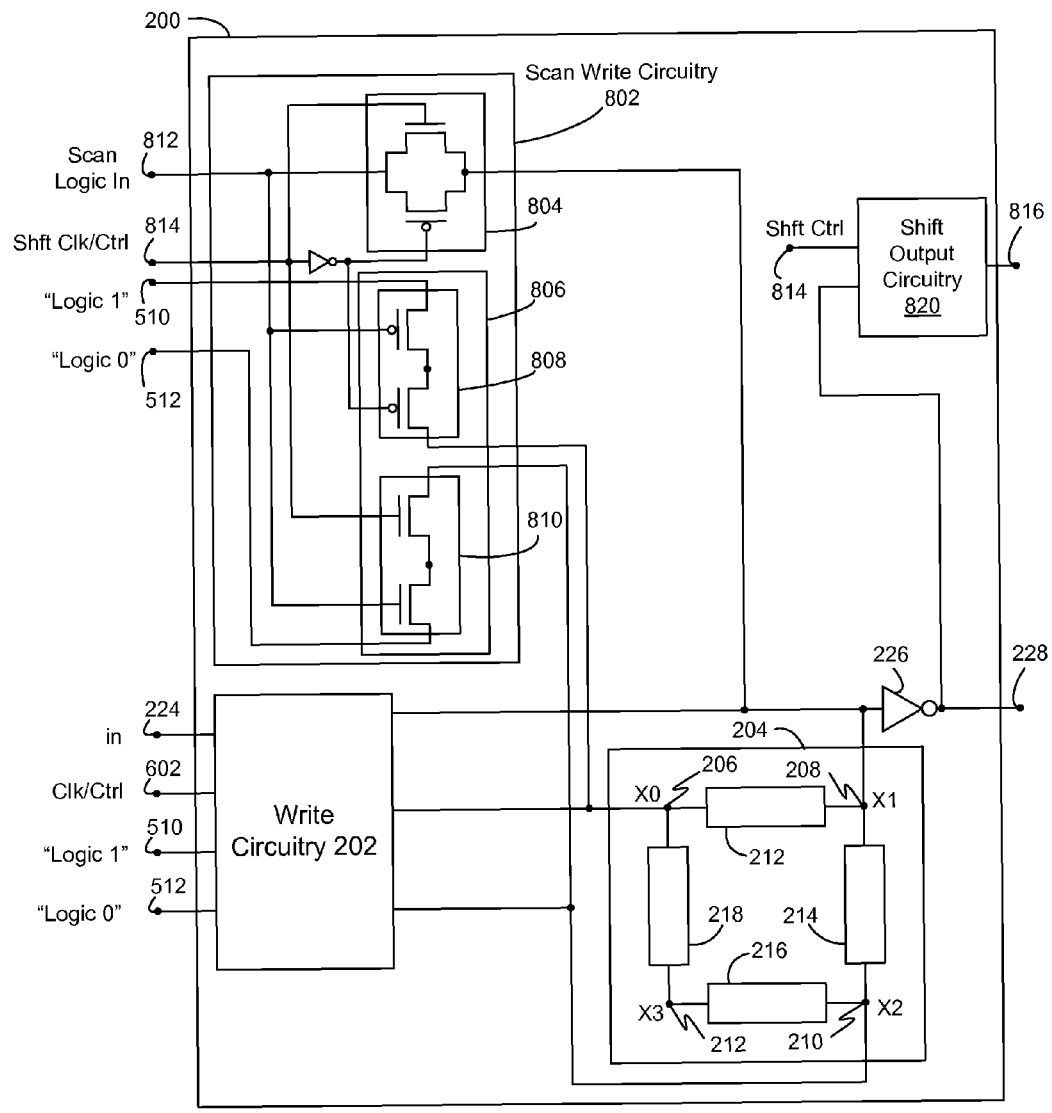
FIG. 8 is another exemplary circuit diagram of the redundant storage system including scan test circuitry.

FIG. 8 is another exemplary circuit diagram of system 200, including scan write circuitry 802. Scan write circuitry 802 includes write circuitry 804 to write logic values received at a scan logic input node 812 to storage node X1, in response to a shift control signal received at a shift control node 814.

Scan write circuitry 802 includes opposite sense write circuitry 806, which may include a predominantly P-type single logic level write circuit 808 to write a logic 1 to storage node X0, and a predominantly N-type single logic level write circuit 810, to write a logic a logic 0 to storage node X2, in response to logic values at scan logic input node 812 and the shift control signal at shift control node 814.

System 200 may further include scan output circuitry 820 to output logic values from node X1 to a shift out node 816, under control of the shift control signal at shift control node 814.

Scan logic input node 812 may be coupled to a shift out node of another system 200, and shift out node 816 may be coupled to a scan logic input node of another system 200, in a daisy-chain fashion.

Methods and systems are disclosed herein with the aid of functional building blocks illustrating the functions, features, and relationships thereof. At least some of the boundaries of these functional building blocks have been arbitrarily defined herein for the convenience of the description. Alternate boundaries may be defined so long as the specified functions and relationships thereof are appropriately performed. One skilled in the art will recognize that these functional building blocks can be implemented by discrete components, application specific integrated circuits, processors executing appropriate software, and combinations thereof.

What is claimed is:

1. A system, comprising:
    a storage cell having first and second same sense storage nodes and first and second opposite sense storage nodes; and
    write circuitry coupled to an input node, the first same sense storage node, and the first and second opposite sense storage nodes to write logic values from the input node to the first same sense storage node, and to selectively write opposite sense logic values to one of the first and second opposite sense storage nodes responsive to the logic values.

2. The system according to claim 1, wherein the write circuitry includes:
    a write circuit coupled to the input node and the first same sense storage node to write the logic values from the input node to the first same sense storage node; and
    an opposite sense write circuit coupled to the input node and the first and second opposite sense storage nodes to write a logic value of one to the first opposite sense storage node when the input logic value is zero, and to write a logic value of zero to the second opposite sense storage node when the input logic value is one.

3. The system according to claim 2, wherein the write circuit includes a multiple logic level write circuit and the opposite sense write circuit includes:
a first single-logic level write circuit coupled between a logic one node and the first opposite sense storage node; and
a second single-logic level write circuit coupled between a logic zero node and the second opposite sense storage node.

4. The system according to claim 3, wherein:
the first single-logic level write circuit includes a P-type switch device coupled between the logic one node and the first opposite sense storage node, the P-type switch device including a control node coupled to the input node; and
the second single-logic level write circuit includes an N-type switch device coupled between the logic zero node and the second opposite sense storage node, the N-type switch device including a control node coupled to the input node.

5. The system according to claim 1, further including:
an output node coupled to an output of the write circuitry and to the first same sense storage node to output the logic values substantially simultaneously with corresponding writes of the logic values to the first same sense storage node.

6. The system according to claim 1, further including:
scan test write circuitry coupled to a scan input node, the first same sense storage node, and the first and second opposite sense storage nodes to write scan logic values from the scan input node to the first same sense storage node, and to selectively write opposite sense scan logic values to one of the first and second opposite sense storage nodes responsive to the scan logic value.

7. A system, comprising:
a storage cell having first and second same sense storage nodes and first and second opposite sense storage nodes;
a multiple logic level write circuit coupled between an input node and the first same sense storage node;
a first single logic level write circuit coupled between a logic one node and the first opposite sense storage node, the first single logic level write circuit including a control node coupled to the input node; and
a second single logic level write circuit coupled between a logic zero node and the second opposite sense storage node, the second single logic level write circuit including a control node coupled to the input node.

8. The system according to claim 7, wherein:
the first single logic level write circuit includes a first P-type switch device coupled between the logic one node and the first opposite sense storage node, the first P-type switch device including the control node coupled to the input node; and
the second single logic level write circuit includes a first N-type switch device coupled between the logic zero node and the second opposite sense storage node, the first N-type switch device including the control node coupled to the input node.

9. The system according to claim 8, wherein:
the first single logic level write circuit further includes a second P-type switch device coupled between the first P-type switch device and the first opposite sense storage node, the second P-type switch device including a control node coupled to an input control node through an inverter; and the second single logic level write circuit includes a second N-type switch device coupled between the first N-type switch device and the second opposite sense storage node, the second N-type switch device including a control node coupled to the input control node.

10. The system according to claim 7, further including:
an output node coupled to an output of the write circuitry and to the first same sense storage node to output the logic values substantially simultaneously with corresponding writes of the logic values to the first same sense storage node.

11. The system according to claim 7, further including:
a multiple logic level scan write circuit coupled between a scan input node and the first same sense storage node;
a first single logic level scan write circuit coupled between a logic one node and the first opposite sense storage node, the first single logic level scan write circuit including a control node coupled to the scan input node; and
a second single logic level scan write circuit coupled between a logic zero node and the second opposite sense storage node, the second single logic level scan write circuit including a control node coupled to the scan input node.

12. The system according to claim 11, wherein:
the first single logic level scan write circuit includes a first P-type switch device coupled between the logic one node and the first opposite sense storage node, the first P-type switch device including the control node coupled to the scan input node; and
the second single logic level scan write circuit includes a first N-type switch device coupled between the logic zero node and the second opposite sense storage node, the first N-type switch device including the control node coupled to the scan input node.

13. The system according to claim 12, wherein:
the first single logic level scan write circuit further includes a second P-type switch device coupled between the first P-type switch device and the first opposite sense storage node, the second P-type switch device including a control node coupled to a scan shift control node through an inverter; and
the second single logic level scan write circuit includes a second N-type switch device coupled between the first N-type switch device and the second opposite sense storage node, the second N-type switch device including a control node coupled to the scan shift control node.

14. A method, comprising:
writing logic values to a first same sense storage node of a storage cell having first and second same sense storage nodes and first and second opposite sense storage nodes;
selectively writing opposite senses of the logic values to one of the first and second opposite sense storage nodes responsive to the logic values.

15. The method of claim 14, wherein the selectively writing includes:
writing a logic value of zero to the first opposite sense storage node when the logic value is one; and
writing a logic value of one to the second opposite sense storage node when the logic value is zero.

16. The method according to claim 14, further including:
outputting the logic values substantially simultaneously with corresponding writings of the logic values to the first same sense storage node.

17. The method according to claim 14, further including:
writing scan test logic values to the first same sense storage node; and selectively writing opposite senses of the scan test logic values to one of the first and second opposite sense storage nodes responsive to the scan test logic values.

18. The system according to claim 1, further including:
a pulse generator coupled between the write circuitry and an input clock node to receive a clock signal and to output a pulse signal to control the write circuitry to write the logic values in response to the pulse signal.

19. The system according to claim 9, further including:
a pulse generator coupled between a clock source and the control node.

20. The method according to claim 14, further including:
writing the logic values in response to a pulse control signal.

* * * * *